United States Patent
Janssen et al.

(10) Patent No.: US 6,597,429 B2
(45) Date of Patent: Jul. 22, 2003

(54) LITHOGRAPHIC APPARATUS, DEVICE MANUFACTURING METHOD, AND DEVICE MANUFACTURED THEREBY

(75) Inventors: Eric W. A. Janssen, Eindhoven (NL); Marcel J. M. Renkens, Geleen (NL); Jakob Vijfvinkel, Eindhoven (NL); Ronald M. Schneider, Eindhoven (NL); Theo H. J. Bisschops, Eindhoven (NL); Rob Tabor, Helmond (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 09/833,077

(22) Filed: Apr. 12, 2001

(65) Prior Publication Data

US 2002/0021425 A1 Feb. 21, 2002

(30) Foreign Application Priority Data

Apr. 17, 2000 (EP) ............................................. 00201355

(51) Int. Cl.⁷ .......................... G03B 27/42; G03B 27/58
(52) U.S. Cl. .......................... 355/53; 355/72; 250/492.2
(58) Field of Search ............................. 355/53, 72, 75; 248/550, 562; 250/492.2

(56) References Cited

U.S. PATENT DOCUMENTS

| | | |
|---|---|---|
| 4,349,244 A | 9/1982 | Hellriegel |
| 4,818,838 A | 4/1989 | Young et al. |
| 4,907,021 A | 3/1990 | Yabu |
| 5,150,153 A | 9/1992 | Franken et al. |
| 5,204,712 A * | 4/1993 | Bouwer et al. ................. 355/53 |
| 5,229,872 A * | 7/1993 | Mumola ....................... 349/116 |
| 5,296,891 A * | 3/1994 | Vogt et al. .................... 347/258 |
| 5,337,560 A | 8/1994 | Abdelmalek |
| 5,376,988 A | 12/1994 | Osanai |
| 5,467,720 A * | 11/1995 | Korenaga et al. ............. 248/566 |
| 5,523,193 A * | 6/1996 | Nelson ....................... 346/107.1 |
| 5,858,587 A | 1/1999 | Yamane et al. |
| 5,864,389 A * | 1/1999 | Osanai et al. ............. 250/492.2 |
| 5,986,743 A * | 11/1999 | Hanzawa ..................... 248/550 |
| 6,046,792 A * | 4/2000 | Van Der Werf et al. ....... 355/53 |
| 6,226,075 B1 | 5/2001 | Loopstra et al. |
| 6,337,484 B1 * | 1/2002 | Loopstra et al. ......... 250/442.11 |

FOREIGN PATENT DOCUMENTS

| | | | |
|---|---|---|---|
| EP | 0973067 | * | 1/2000 |
| WO | WO 96/38766 | | 12/1996 |

* cited by examiner

Primary Examiner—Alan A. Mathews
(74) Attorney, Agent, or Firm—Pillsbury Winthrop LLP

(57) ABSTRACT

A lithographic projection apparatus comprises a vacuum chamber having a wall enclosing at least one of first and second object tables, the or each object table within the vacuum chamber being connected to positioning means for positioning the object table with respect to a projection system of the apparatus. The positioning means is provided with a pneumatic gravity compensator comprising a piston associated with the object table; a gas-filled pressure chamber, the gas in the pressure chamber acting on the movable member to at least partially counteract the weight of the object table; a gas bearing; and evacuating means for evacuating gas escaping through a gap between the movable member and a bearing surface of a cylindrical housing towards the vacuum chamber. A partially flexible rod connects the piston to the object table.

40 Claims, 4 Drawing Sheets

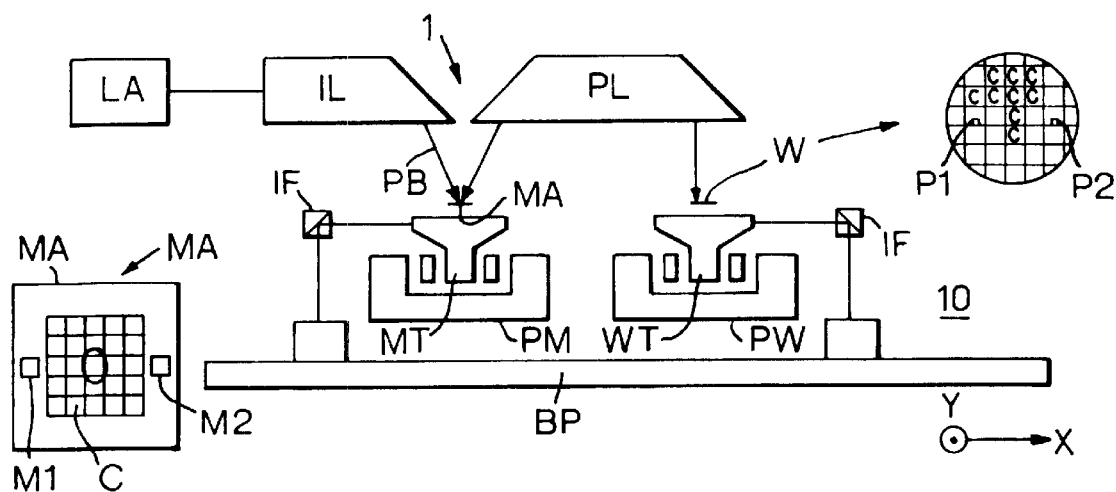
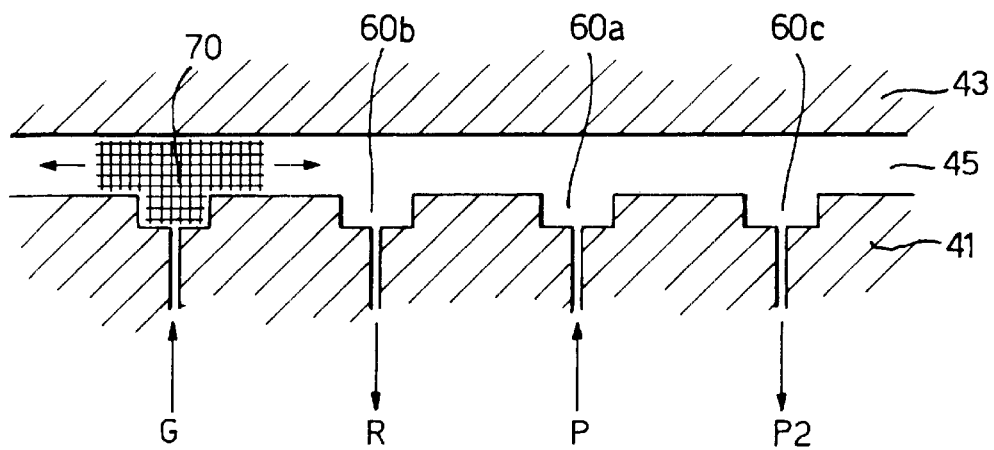

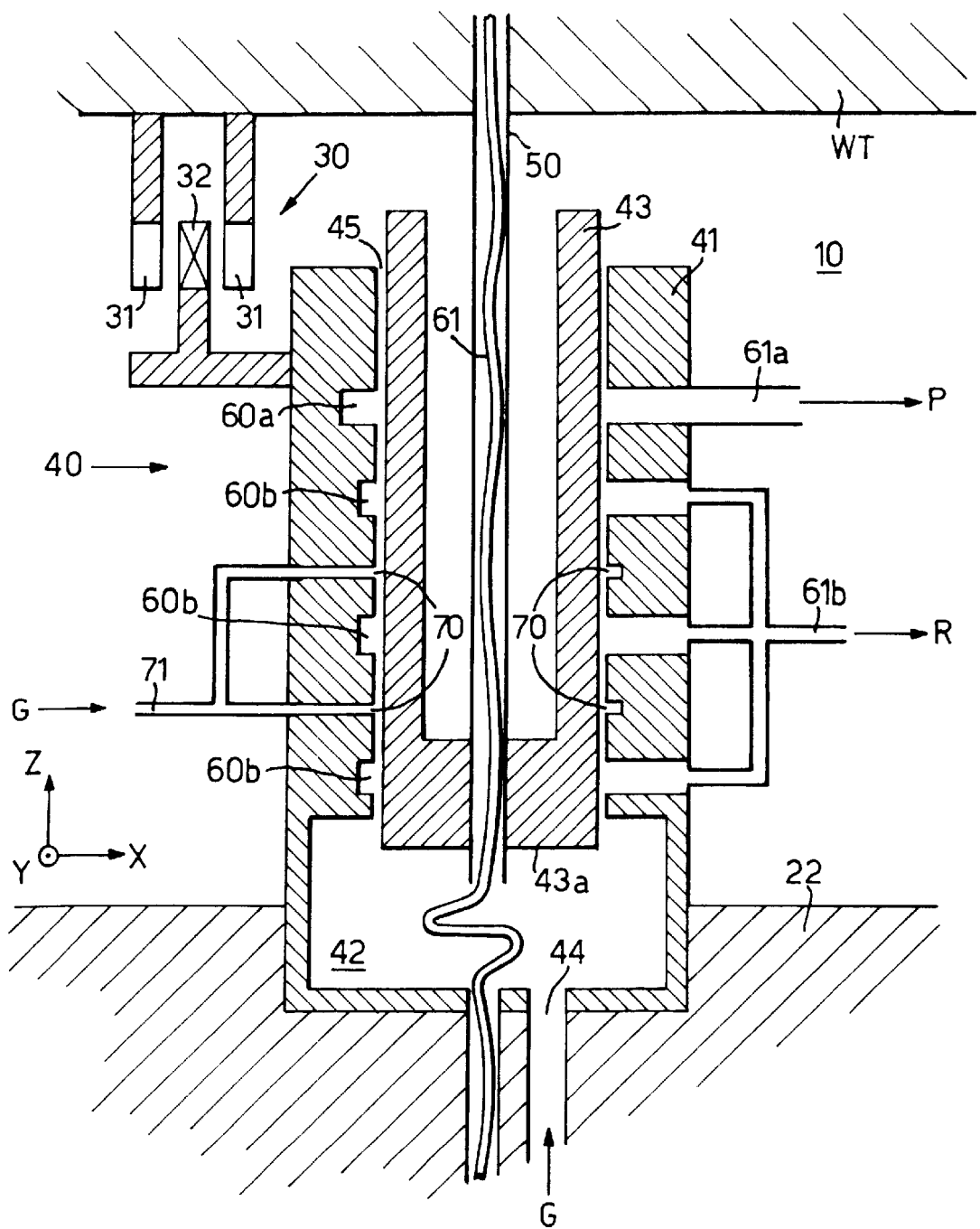

LITHOGRAPHIC APPARATUS, DEVICE MANUFACTURING METHOD, AND DEVICE MANUFACTURED THEREBY

BACKGROUND OF THE INVENTION

1. Field of the Invention

The present invention relates generally to a lithographic projection apparatus and more specifically to a lithographic projection apparatus including a radiation system for supplying a projection beam of radiation, a support to support patterning structure, the patterning structure serving to pattern the projection beam according to a desired pattern, a substrate table to hold a substrate, and a projection system to project the patterned beam onto a target portion of the substrate.

2. Description of the Related Art

The terms "patterning means", "patterning structure" or "mask" as here employed should be broadly interpreted as referring to means that can be used to endow an incoming radiation beam with a patterned cross-section, corresponding to a pattern that is to be created in a target portion of the substrate; the term "light valve" can also be used in this context. Generally, the pattern will correspond to a particular functional layer in a device being created in the target portion, such as an integrated circuit or other device (see below). Examples of such patterning means include:

A mask. The concept of a mask is well known in lithography, and it includes mask types such as binary, alternating phase-shift, and attenuated phase-shift, as well as various hybrid mask types. Placement of such a mask in the radiation beam causes selective transmission (in the case of a transmissive mask) or reflection (in the case of a reflective mask) of the radiation impinging on the mask, according to the pattern on the mask. In the case of a mask, the support structure will generally be a mask table, which ensures that the mask can be held at a desired position in the incoming radiation beam, and that it can be moved relative to the beam if so desired.

A programmable mirror array. An example of such a device is a matrix-addressable surface having a viscoelastic control layer and a reflective surface. The basic principle behind such an apparatus is that (for example) addressed areas of the reflective surface reflect incident light as diffracted light, whereas unaddressed areas reflect incident light as undiffracted light. Using an appropriate filter, the undiffracted light can be filtered out of the reflected beam, leaving only the diffracted light behind; in this manner, the beam becomes patterned according to the addressing pattern of the matrix-addressable surface. The required matrix addressing can be performed using suitable electronic means. More information on such mirror arrays can be gleaned, for example, from U.S. Pat. Nos. 5,296,891 and 5,523,193, which are incorporated herein by reference. In the case of a programmable mirror array, the support structure may be embodied as a frame or table, for example, which may be fixed or movable as required.

A programmable LCD array. An example of such a construction is given in U.S. Pat. No. 5,229,872, which is incorporated herein by reference. As above, the support structure in this case may be embodied as a frame or table, for example, which may be fixed or movable as required.

For purposes of simplicity, the rest of this text may, at certain locations, specifically direct itself to examples involving a mask and mask table; however, the general principles discussed in such instances should be seen in the broader context of the patterning means as herein set forth above.

Lithographic projection apparatus can be used, for example, in the manufacture of integrated circuits (ICs). In such a case, the patterning structure may generate a circuit pattern corresponding to an individual layer of the IC, and this pattern can be imaged onto a target portion (e.g. comprising one or more dies) on a substrate (silicon wafer) that has been coated with a layer of radiation-sensitive material (resist). In general, a single wafer will contain a whole network of adjacent target portions that are successively irradiated via the projection system, one at a time. In current apparatus, employing patterning by a mask on a mask table, a distinction can be made between two different types of machine. In one type of lithographic projection apparatus, each target portion is irradiated by exposing the entire mask pattern onto the target portion at once; such an apparatus is commonly referred to as a wafer stepper. In an alternative apparatus—commonly referred to as a step-and-scan apparatus—each target portion is irradiated by progressively scanning the mask pattern under the projection beam in a given reference direction (the "scanning" direction) while synchronously scanning the substrate table parallel or anti-parallel to this direction; since, in general, the projection system will have a magnification factor M (generally <1), the speed V at which the substrate table is scanned will be a factor M times that at which the mask table is scanned. More information with regard to lithographic devices as here described can be gleaned, for example, from U.S. Pat. No. 6,046,792, incorporated herein by reference.

In a manufacturing process using a lithographic projection apparatus, a pattern (e.g. in a mask) is imaged onto a substrate that is at least partially covered by a layer of radiation-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4, incorporated herein by reference.

For the sake of simplicity, the projection system may hereinafter be referred to as the "lens"; however, this term should be broadly interpreted as encompassing various types of projection system, including refractive optics, reflective optics, and catadioptric systems, for example. The radiation system may also include components operating according to any of these design types for directing, shaping or controlling the projection beam of radiation, and such components may also be referred to below, collectively or singularly, as a "lens". Further, the lithographic apparatus may be of a type having two or more substrate tables (and/or two or more mask tables). In such "multiple stage" devices the additional tables may be used in parallel, or preparatory steps may be carried out on one or more tables while one or more other tables are being used for exposures. Twin stage lithographic apparatus are described, for example, in U.S. Pat. No. 5,969,441 and WO 98/40791, incorporated herein by reference.

In a lithographic apparatus, the size of features that can be imaged onto the wafer is limited by the wavelength of the projection radiation. To produce integrated circuits with a higher density of devices and hence higher operating speeds, it is desirable to be able to image smaller features. While most current lithographic projection apparatus employ ultraviolet light generated by mercury lamps or excimer lasers, it has been proposed to use shorter wavelength radiation of around 13 nm. Such radiation is termed extreme ultraviolet (EUV) or soft x-ray, and possible sources include laser-produced plasma sources, discharge sources or synchrotron radiation from electron storage rings. An outline design of a lithographic projection apparatus using synchrotron radiation is described in "Synchrotron radiation sources and condensers for projection x-ray lithography", J B Murphy et al, Applied Optics Vol. 32 No. 24 pp 6920–6929 (1993).

Other proposed radiation types include electron beams and ion beams. These types of beam share with EUV the requirement that the beam path, including the mask, substrate and optical components, be kept in a high vacuum. This is to prevent absorption and/or scattering of the beam, whereby a total pressure of less than about $10^{-6}$ millibar is typically necessary for such charged particle beams. Wafers can be contaminated, and optical elements for EUV radiation can be spoiled, by the deposition of carbon layers on their surface, which imposes the additional requirement that hydrocarbon partial pressures should generally be kept below $10^{-8}$ or $10^{-9}$ millibar. Otherwise, for apparatus using EUV radiation, the total vacuum pressure need only be $10^{-3}$ or $10^{-4}$ mbar, which would typically be considered a rough vacuum. Further information with regard to the use of electron beams in lithography can be gleaned, for example, from U.S. Pat. No. 5,079,122 and U.S. Pat. No. 5,260,151, as well as from EP-A-0 965 888, which are incorporated by reference.

Working in such a high vacuum imposes quite onerous conditions on the components that must be put into the vacuum and on the vacuum chamber seals, especially those around any part of the apparatus where a motion must be fed-through to components inside the chamber from the exterior. For components inside the chamber, materials that minimise or eliminate contaminant and total outgassing, i.e. both outgassing from the materials themselves and from gases adsorbed on their surfaces, should be used.

For certain applications, a gravity compensator is required to exert a bias force that at least partially counteracts the weight of an object to be supported and which compensator largely prevents transmission of vibrations in the support direction. The height of the object may be varied by motors, and the application of a gravity compensator relieves the motors of supplying a force to overcome gravity, leading to a considerable reduction in power consumption and heating of the motors. However, such gravity compensators having a pneumatic working principle are known, but their application in a vacuum environment is presently not feasible, since the possible escape of gas from the gravity compensator would seriously disturb the vacuum. To prevent transmission of vibrations in a horizontal direction, it is known to provide a supporting means, such as a pneumatic gravity compensator, with a horizontal air bearing. Gas flowing out of the horizontal gas bearing will seriously disturb the vacuum. Above supporting means are described in EP 0 973 067, which is incorporated herein by reference.

SUMMARY OF THE INVENTION

A lithographic projection apparatus in accordance with one aspect of the present invention includes a radiation system for providing a projection beam of radiation, a support structure to support patterning structure, the patterning structure serving to pattern the projection beam according to a desired pattern, a substrate table to hold a substrate, a projection system to project the patterned beam onto a target portion of the substrate, and a supporting structure comprising a support member having a finite stiffness in a perpendicular direction that is substantially perpendicular to a support direction of the support member.

In a further embodiment of the present invention, the apparatus further comprises a vacuum chamber having a wall enclosing the support means, wherein the supporting means further comprises a gas-filled pressure chamber, the gas in the pressure chamber acting on a movable member such as to at least partially counteract a force substantially parallel to the support direction, and evacuating means constructed and arranged so as to evacuate gas escaping towards the vacuum chamber through a gap between the movable member and a bearing surface.

According to yet a further aspect of the invention there is provided a method of manufacturing a device including providing a substrate that is at least partially covered by a layer of radiation sensitive material, providing a projection beam of radiation using a radiation system, using patterning structure to endow the projection beam with a pattern in its cross-section, projecting the patterned beam of radiation onto a target portion of the layer of radiation-sensitive material; and providing an isolated reference frame characterized by supporting one of the support structure, the substrate table and the isolated reference frame with a support member having a finite stiffness in a perpendicular direction that is substantially perpendicular to a support direction of the support member.

Although specific reference may be made in this text to the use of the apparatus according to the invention in the manufacture of ICs, it should be explicitly understood that such an apparatus has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as being replaced by the more general terms "mask", "substrate" and "target portion", respectively.

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range 5–20 nm), as well as particle beams, such as ion beams or electron beams.

BRIEF DESCRIPTION OF THE DRAWINGS

The invention and its attendant advantages will be further elucidated with the aid of an exemplary Embodiment and the accompanying schematic drawings, in which:

FIG. 1 depicts a lithographic projection apparatus according to an embodiment of the invention;

FIG. 3 depicts a detail of evacuating means according to the invention;

FIG. 5 depicts part of short-stroke positioning means according to embodiment 2 of the present invention.

Corresponding features in the various figures are denoted by the same reference symbols.

DETAILED DESCRIPTION OF THE INVENTION

Embodiment 1

Figure 2:
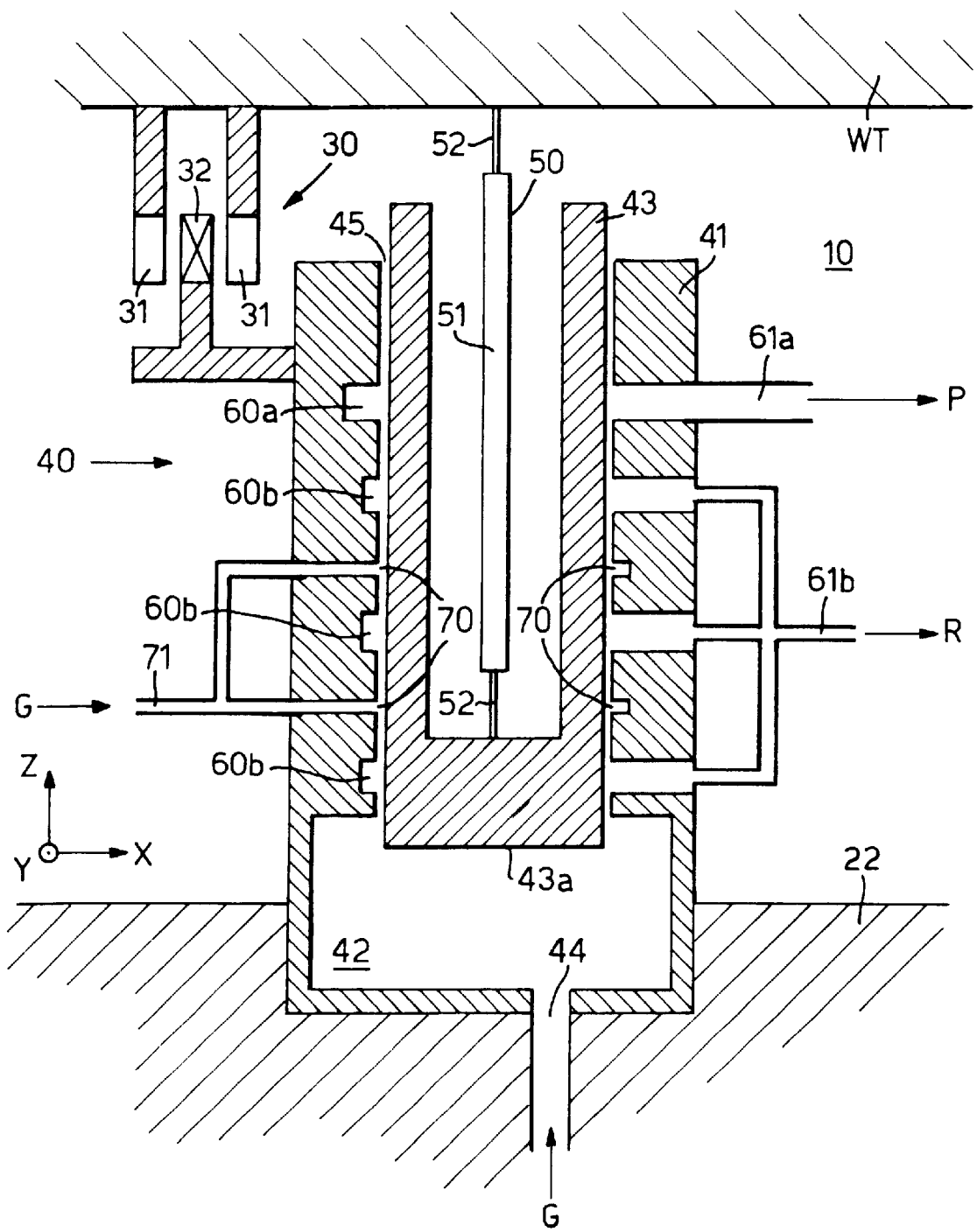
FIG. 2 depicts part of short-stroke positioning means according to the invention.

FIG. 1 schematically depicts a lithographic projection apparatus according to a particular embodiment of the invention. The apparatus comprises:

- a radiation system Ex, IL, for supplying a projection beam PB of radiation (e.g. UV or EUV radiation, electrons or ions). In this particular case, the radiation system also comprises a radiation source LA;
- a first object table (mask table) MT provided with a mask holder for holding a mask MA (e.g. a reticle), and connected to first positioning means for accurately positioning the mask with respect to item PL;
- a second object table (substrate table) WT provided with a substrate holder for holding a substrate W (e.g. a resist-coated silicon wafer), and connected to second positioning means for accurately positioning the substrate with respect to item PL;
- a projection system ("lens") PL (e.g. a refractive or catadioptric system, a mirror group or an array of field deflectors) for imaging an irradiated portion of the mask MA onto a target portion C (e.g. comprising one or more dies) of the substrate W.

As here depicted, the apparatus is of a reflective type (i.e. has a reflective mask). However, in general, it may also be of a refractive type, for example (with a transmissive mask). Alternatively, the apparatus may employ another kind of patterning means, such as a programmable mirror array of a type as referred to above.

The source LA (e.g. an excimer laser, an undulator or wiggler provided around the path of an electron beam in a storage ring or synchrotron, a laser-produced plasma source, a discharge source or an electron or ion beam source) produces a beam of radiation. This beam is fed into an illumination system (illuminator) IL, either directly or after having traversed conditioning means, such as a beam expander, for example. The illuminator may comprise adjusting means for setting the outer and/or inner radial extent (commonly referred to as σ-outer and σ-inner, respectively) of the intensity distribution in the beam. In addition, it will generally comprise various other components, such as an integrator and a condenser. In this way, the beam PB impinging on the mask MA has a desired uniformity and intensity distribution in its cross-section.

It should be noted with regard to FIG. 1 that the source LA may be within the housing of the lithographic projection apparatus (as is often the case when the source LA is a mercury lamp, for example), but that it may also be remote from the lithographic projection apparatus, the radiation beam which it produces being led into the apparatus (e.g. with the aid of suitable directing mirrors); this latter scenario is often the case when the source LA is an excimer laser. The current invention and claims encompass both of these scenarios.

The beam PB subsequently intercepts the mask MA, which is held on a mask table MT. Having been reflected by the mask MA, the beam PB passes through the lens PL, which focuses the beam PB onto a target portion C of the substrate W. With the aid of the second positioning means (and interferometric measuring means IF), the substrate table WT can be moved accurately, e.g. so as to position different target portions C in the path of the beam PB. Similarly, the first positioning means can be used to accurately position the mask MA with respect to the path of the beam PB, e.g. after mechanical retrieval of the mask MA from a mask library, or during a scan. In general, movement of the object tables MT, WT will be realized with the aid of a long-stroke module (course positioning) and a short-stroke module (fine positioning), which are not explicitly depicted in FIG. 1. However, in the case of a wafer stepper (as opposed to a step-and-scan apparatus) the mask table MT may just be connected to a short-stroke actuator, or may be fixed.

The depicted apparatus can be used in two different modes:

1. In step mode, the mask table MT is kept essentially stationary, and an entire mask image is projected at once (i.e. a single "flash") onto a target portion C. The substrate table WT is then shifted in the x and/or y directions so that a different target portion C can be irradiated by the beam PB;
2. In scan mode, essentially the same scenario applies, except that a given target portion C is not exposed in a single "flash". Instead, the mask table MT is movable in a given direction (the so-called "scan direction", e.g. the y direction) with a speed v, so that the projection beam PB is caused to scan over a mask image; concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

The embodiment shown employs a projection beam of EUV radiation and is therefore provided with a vacuum environment, or chamber, 10 since most gases tend to absorb the EUV radiation.

FIG. 2 shows a part of the short-stroke positioning means connected to the substrate table WT, which positioning means is employed for fine positioning of the substrate W (not shown in FIG. 2) with respect to the projection system PL. The lower part, or foot, 22 of the shown configuration is connected to the long-stroke positioning means (not shown) for coarse positioning of the substrate table WT with respect to the projection system PL. This foot 22 is able to move over base plate BP (shown in FIG. 1). The configuration as shown in FIG. 2 is mounted in vacuum chamber 10.

Substrate table WT may be changed in height with respect to lower part 22 with the aid of short-stroke motors taking the form of so-called Lorentz-force motors. One Lorentz-force motor 30 for changing the height is schematically depicted in FIG. 2 and comprises a system of permanent magnets 31 mounted such as to have an identical magnetic orientation and a system of electric conductors 32 that may carry an electrical current for generating a Lorentz force in the vertical Z-direction to vary the distance in between substrate table WT and lower part 22. In general, more than one Lorentz-force motor for the vertical direction is provided. The system of magnets 31 is secured to substrate table WT and the system of electrical conductors 32 is secured to lower part 22. Further Lorentz-force motors (not shown) are present to horizontally displace, tilt and rotate substrate table WT with respect to lower part 22. Dimensions of the Lorentz-force motors are chosen such that a displacement induced by one Lorentz-force motor is not obstructed by the other Lorentz-force motors over a selected short-stroke range of displacement.

A supporting means, or gravity compensator, 40 is provided to at least substantially support substrate table WT against gravity with respect to lower part 22. Lorentz-force motor 30 is therefore relieved of generating such a supporting force, which would lead to a high energy dissipation in conductors 32. In general, more than one gravity compensator will be provided.

Gravity compensator 40 comprises a cylindrical housing 41 provided with a pressure chamber 42, and a piston 43 which is journaled relative to said housing in the vertical, or support, direction. Housing 41 is secured to lower part 22 and piston 43 is through a rod 50 connected to substrate table WT. Pressure chamber 42 is in fluid communication with gas supply means G (not shown) via a channel 44 to provide a gas having a predetermined pressure in the pressure chamber. In this manner a pneumatic supporting force is generated to vertically support piston 43 in housing 41 by the gas pressure present in pressure chamber 42 and acting on bottom surface 43a of piston 43. The gas supply means regulates the pressure in pressure chamber 42 such that the pneumatic supporting force will support substrate table WT against gravity. The supporting force is essentially constant, irrespective of the position of piston 43 in the vertical Z-direction.

For further details on long-stroke and short-stroke positioning means and on gravity-compensators, one is referred to European patent application EP 0 973 067, which is incorporated herein by reference.

Gas may escape from pressure chamber 42 via the gap 45 in between piston 43 and the inner wall of cylindrical housing 41 and enter vacuum chamber 10, which would substantially disturb the vacuum within the vacuum chamber. The inner wall of housing 41 acts as a bearing surface for piston 43. To prevent gas from escaping to vacuum chamber 1 0, gravity compensator 40 is provided with evacuating grooves 60a, 60b in its inner wall surrounding piston 43. Grooves 60a, 60b are via conduits 61a, 61b connected to a vacuum pump P (not shown) and a reservoir R (not shown), respectively, to draw gas from the grooves and gap 45. Gas escaping through gap 45 in between housing 41 and piston 43 will thus substantially escape via grooves 60a, 60b to reservoir R and vacuum pump P, and not towards vacuum chamber 10. Vacuum groove 60a will be set to a lower pressure than grooves 60b. Depending on the required vacuum level of chamber 10, more vacuum grooves may be provided, each groove in a direction towards the vacuum chamber being evacuated to a lower pressure level, i.e. a higher vacuum level.

As shown in FIG. 2, two gas bearings 70 are provided in between the inner wall of housing 41 and piston 43. The gas bearings provide for a friction-less displacement of piston 43 within housing 41, so as to prevent a transmission of vibrations from lower part 22 to substrate table WT in the vertical direction. Gas at a pressure of a few bars is introduced from a gas supply G via conduits 71 to gap 45 to establish the gas bearings 70. Grooves 60b are provided aside the gas bearings to evacuate gas introduced from gap 45, so as to prevent the escape of gas to vacuum chamber 10 and to provide for stable gas bearings 70. In the embodiment shown, the gas bearings are set to an identical pressure.

However, the pressure may be set to different pressures by separated conduits 71 in a further embodiment. Further, more than two or just one gas bearing may be provided.

FIG. 3 shows a detail of air bearing 70 and pressure relief structure including evacuating grooves 60a, 60b. Air bearing 70 may be set to a pressure of 6 bar and grooves 60b allow gas to escape to a reservoir R at atmospheric pressure. Vacuum groove 60a is connected to a vacuum pump P (not shown) that allows evacuating to a pressure level of 1.5 mbar. Gaps having a length of 5–10 mm and a width of 2–25 μm in between gas bearing 70 and groove 60b, groove 60b and groove 60a, and groove 60a and vacuum chamber allow a vacuum of $5 \times 10^{-7}$ mbar to be reached within vacuum chamber 10. FIG. 3 also shows a further vacuum groove 60c connected to a further vacuum pump P2 to allow an even higher vacuum to be reached in vacuum chamber 10.

Figure 4A:
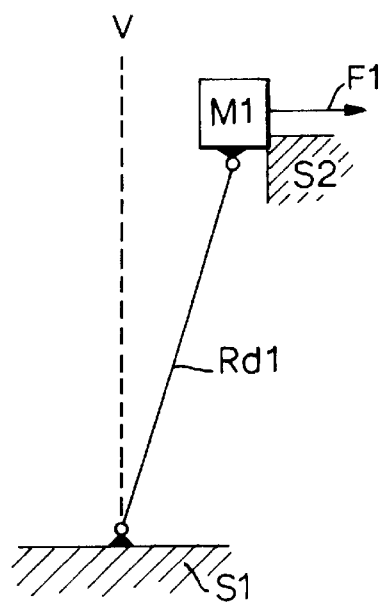
FIG. 4a depicts a schematic representation of a mass on a hingedly connected rigid rod.
Figure 4B:
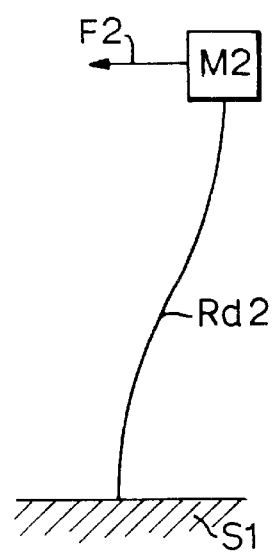
FIG. 4b depicts a schematic representation of a mass on a rigidly connected flexible rod.

Rod 50 connects piston 43 to substrate table WT and allows for displacement of upper part in a horizontal XY-plane, i.e. perpendicular to the support direction. The configuration of rod 50 is chosen such that it stably supports substrate table WT, but also allows displacement in the horizontal plane with negligible or no force exerted on the substrate table in the horizontal direction. A transmission of vibrations to the substrate table in the horizontal plane is therefore largely prevented. FIGS. 4a and 4b further demonstrate above requirements for rod 50.

A mass M1 supported by a rigid rod Rd1 that is hingedly connected to mass M1 and supporting surface S1 will, due to gravity acting along the vertical support direction, exert a force F1 in the horizontal plane on some support S2 when mass M1 is not exactly positioned above the connection of rod Rd1 to supporting surface S1, i.e. when M1 is displaced with respect to the vertical V, its gravitational equilibrium state. Such a situation is shown in FIG. 4a. A flexible rod Rd2 that is rigidly secured to both mass M2 and supporting surface S1 will exert a force F2 in the horizontal plane on mass M2 when the latter is displaced from the vertical V and the bottom surface of mass M2 is kept parallel to supporting surface S1, as is shown in FIG. 4b, such that a bending moment is exerted on flexible rod Rd2. However, mass M2 will also exert a force F1 on rod Rd2 as is explained with reference to FIG. 4a, force F1 being opposed to force F2. The configuration of rod Rd2 may be chosen such that forces F1 and F2 will at least substantially cancel each other. Mass M2 will then stably balance on rod Rd2 and may be displaced in the horizontal XY-plane around vertical V without a substantial force being exerted on mass M2. The gravity force acting parallel to the support direction thus provides a so called "negative stiffness" to rod 50.

Rod 50 in FIG. 2 is configured, i.e. has stiffness in a direction perpendicular to the support direction, such that the situation as explained with reference to FIG. 4b is applicable. The rod may be made of a solid material having a uniform stiffness throughout its length, but the rod may also comprise (as shown in FIG. 2) a rigid intermediate part 51 and two flexible parts 52. One flexible part is rigidly secured to piston 43 and the other flexible part is rigidly secured to substrate table WT. The elasticity, length and cross-sectional shape of the flexible parts have to be chosen so as to comply with a selected length of rod 50 and the mass of substrate table WT, such that the situation as explained with regard to FIG. 4b holds.

Embodiment 2

FIG. 5 shows schematically a supporting means 40 according to a second embodiment in which rod 50 is provided with a hollow part. Through the hollow part a conduit 61 may be fed, through which, for example, a liquid (e.g., cooling water) or an electrical or signal connection is provided to the substrate table WT. Conduits 61 are generally made of materials that tend to release undesirable contaminants in a vacuum environment. The proposed arrangement prevents such contamination.

Embodiment 3

Figure 6:
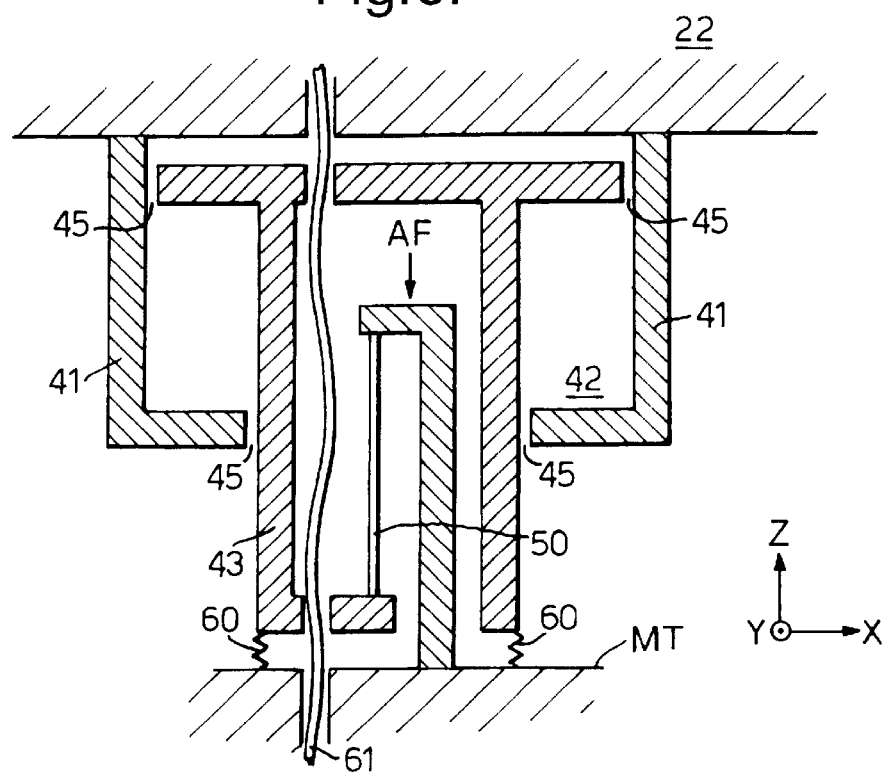
FIG. 6 depicts a schematic representation of a supporting means according to embodiment 3.

FIG. 6 depicts schematically a means 40 according to a third embodiment of the invention. In the third embodiment a supported mask table MT is provided below a supporting upper part 22 that is connected to long-stroke positioning means. The various parts as described for the first embodiment can also be distinguished in FIG. 6. The figure further shows that conduits 61 are provided separate from rod 50. A bellows 60 is provided through which conduits 61 are passed to mask table MT. Both bellows 60 and conduits 61 provide an additional stiffness in the horizontal direction, that is, they act as auxiliary support structures. To compensate for such an extra stiffness and, moreover, to generally provide for an adjustable negative stiffness, there is provided a means to generate an adjustable force AF along the support direction. Force AF may be accomplished by addition of an (extra) mass on the mask table MT, by using an (adjustable) spring or by applying air pressure, for example.

While specific embodiments of the invention are disclosed above, it will be appreciated that the invention may be practiced other than described. The description is not intended to limit the invention. For instance, the invention has been described with reference to a wafer or substrate table, but is also applicable to a mask table or vice versa.

What is claimed is:

1. A lithographic projection apparatus comprising:
   a radiation system which provides a projection beam of radiation;
   a patterning structure support to support projection beam patterning structure which patterns the projection beam according to a desired pattern;
   a substrate table to hold a substrate;
   a projection system which projects the patterned beam onto a target portion of the substrate; and
   a support member constructed and arranged to support a portion of the lithographic projection apparatus along a support direction and having a finite stiffness in a direction that is substantially perpendicular to the support direction,
   wherein the stiffness of the support member is such that a deformation force in the perpendicular direction by the support member due to a deformation of the support member in the perpendicular direction substantially counteracts an opposite displacing force in the perpendicular direction due to a force substantially parallel to the support direction acting on the support member.

2. An apparatus according to claim 1, wherein the support member comprises a rod.

3. An apparatus according to claim 2, wherein the rod comprises a rigid part and a flexible part.

4. An apparatus according to claim 1, wherein the support member is provided with a hollow part.

5. An apparatus according to claim 4, wherein a conduit is arranged through the hollow part.

6. An apparatus according to claim 1, wherein the support member supports one of the patterning structure support and the substrate table.

7. An apparatus according to claim 1, wherein the patterning structure support comprises a mask table for holding a mask.

8. An apparatus according to claim 1, wherein the apparatus further comprises an isolated reference frame, and the support member is arranged to support the isolated reference frame.

9. An apparatus according to claim 1, wherein the radiation system comprises a radiation source.

10. An apparatus according to claim 1, wherein an auxiliary support structure to apply an additional force on the support member along the support direction is provided.

11. An apparatus according to claim 1, further comprising a vacuum chamber having a wall enclosing the support member, wherein the support member comprises:
   a gas-filled pressure chamber, the gas in the pressure chamber acting on a movable member such as to at least partially counteract a force substantially parallel to the support direction, and
   a pressure relief structure constructed and arranged to allow evacuation of gas escaping towards the vacuum chamber through a gap between the movable member and a bearing surface.

12. An apparatus according to claim 11, wherein the support member comprises a rod connected to the movable member.

13. An apparatus according to claim 11, wherein the support member further comprises a bearing supporting the movable member and maintaining the gap between the movable member and the bearing surface, the bearing comprising a gas bearing constructed and arranged to provide pressurized gas into the gap thereby generating forces tending to hold the movable member away from the bearing surface, and the pressure relief structure provided between the gas bearing and the vacuum chamber along the movable member so as to remove gas from the gap.

14. An apparatus according to claim 11, wherein the pressure relief structure comprises a conduit providing a fluid communication between the gap and at least one reservoir at a pressure higher than that of the vacuum chamber and lower than that of the gas to be removed from the gap.

15. An apparatus according to claim 11, wherein the pressure relief structure includes a fluid communication between the gap and at least one vacuum pump.

16. An apparatus according to claim 15, wherein the fluid communication comprises more than one elongated vacuum groove in the surface defining the gap, the vacuum grooves being generally parallel and each of the respective grooves being in communication with a progressively lower pressure vacuum in the direction of the vacuum chamber.

17. A lithographic projection apparatus comprising:
   a radiation system which provides a projection beam of radiation;
   a patterning structure support to support projection beam patterning structure which patterns the projection beam according to a desired pattern;
   a substrate table to hold a substrate;
   a projection system which projects the patterned beam onto a target portion of the substrate; and
   a support member constructed and arranged to support a portion of the lithographic projection apparatus along a support direction and having a finite stiffness in a direction that is substantially perpendicular to the support direction;
   wherein an auxiliary support structure to apply an additional force on the support member along the support direction is provided.

18. An apparatus according to claim 17, wherein the stiffness of the support member is such that a deformation force in the perpendicular direction by the support member due to a deformation of the support member in the perpendicular direction substantially counteracts an opposite displacing force in the perpendicular direction due to a force substantially parallel to the support direction acting on the support member.

19. An apparatus according to claim 17, wherein the support member is provided with a hollow part, and
    wherein a conduit is arranged through the hollow part.

20. An apparatus according to claim 17, further comprising a vacuum chamber having a wall enclosing the support member, wherein the support member comprises:
    a gas-filled pressure chamber, the gas in the pressure chamber acting on a movable member such as to at least partially counteract a force substantially parallel to the support direction, and
    a pressure relief structure constructed and arranged to allow evacuation of gas escaping towards the vacuum chamber through a gap between the movable member and a bearing surface.

21. An apparatus according to claim 20, wherein the support member further comprises a bearing supporting the movable member and maintaining the gap between the movable member and the bearing surface, the bearing comprising a gas bearing constructed and arranged to provide pressurized gas into the gap thereby generating forces tending to hold the movable member away from the bearing surface, and the pressure relief structure provided between the gas bearing and the vacuum chamber along the movable member so as to remove gas from the gap.

22. An apparatus according to claim 17, wherein the apparatus further comprises an isolated reference frame, and the support member is arranged to support the isolated reference frame.

23. A lithographic projection apparatus comprising:
    a radiation system which provides a projection beam of radiation;
    a patterning structure support to support projection beam patterning structure which patterns the projection beam according to a desired pattern;
    a substrate table to hold a substrate;
    a projection system which projects the patterned beam onto a target portion of the substrate;
    a support member constructed and arranged to support a portion of the lithographic projection apparatus along a support direction and having a finite stiffness in a direction that is substantially perpendicular to the support direction; and
    a vacuum chamber having a wall enclosing the support member, wherein the support member comprises:
    a rod,
    a gas-filled pressure chamber, the gas in the pressure chamber acting on a movable member such as to at least partially counteract a force substantially parallel to the support direction, and
    a pressure relief structure constructed and arranged to allow evacuation of gas escaping towards the vacuum chamber through a gap between the movable member and a bearing surface.

24. An apparatus according to claim 23, wherein the support member comprises a rod connected to the movable member.

25. An apparatus according to claim 23, wherein the support member further comprises a bearing supporting the movable member and maintaining the gap between the movable member and the bearing surface, the bearing comprising a gas bearing constructed and arranged to provide pressurized gas into the gap thereby generating forces tending to hold the movable member away from the bearing surface, and the pressure relief structure provided between the gas bearing and the vacuum chamber along the movable member so as to remove gas from the gap.

26. An apparatus according to claim 25, wherein the gas bearing comprises an elongate groove in one surface defining the gap; and a gas supply which supplies gas under pressure to said elongate groove.

27. An apparatus according to claim 23, wherein the pressure relief structure comprises a conduit providing a fluid communication between the gap and at least one reservoir at a pressure higher than that of the vacuum chamber and lower than that of the gas to be removed from the gap.

28. An apparatus according to claim 27, wherein the conduit comprises at least one elongate groove in a surface defining the gap.

29. An apparatus according to claim 23, wherein the pressure relief structure includes a fluid communication between the gap and at least one vacuum pump.

30. An apparatus according to claim 29, wherein the fluid communication between the gap and the at least one vacuum pump comprises at least one elongate vacuum groove in a surface defining the gap.

31. An apparatus according to claim 30, wherein the fluid communication comprises more than one elongated vacuum groove in the surface defining the gap, the vacuum grooves being generally parallel and each of the respective grooves being in communication with a progressively lower pressure vacuum in the direction of the vacuum chamber.

32. An apparatus according to claim 23, wherein the movable member comprises a piston being journaled in a housing provided with the gas-filled pressure chamber, an inner wall of the housing providing the bearing surface.

33. A device manufacturing method, using a lithographic projection apparatus, comprising:
    providing a substrate that is at least partially covered by a layer of radiation-sensitive material;
    providing a projection beam of radiation;
    patterning the projection beam of radiation with a pattern in its cross-section;
    projecting the patterned beam of radiation onto a target portion of the layer of radiation-sensitive material, and
    supporting along a support direction one of a support structure of the lithographic projection apparatus, a substrate table of the lithographic projection apparatus and an isolated reference frame of the lithographic projection apparatus with a support member having a finite stiffness in a direction that is substantially perpendicular to the support direction of the support member, said stiffness of the support member is such that a deformation force in the perpendicular direction by the support member due to a deformation of the support member in the perpendicular direction substantially counteracts an opposite displacing force in the perpendicular direction due to a force substantially parallel to the support direction acting on the support member.

34. A device manufactured according to the method of claim 33.

35. A lithographic projection apparatus comprising:

a radiation system which provides a projection beam of radiation;

a patterning structure support to support projection beam patterning structure which patterns a projection beam according to a desired pattern;

a substrate table to hold a substrate;

a projection system which projects the patterned beam onto a target portion of the substrate; and a support member, supporting a portion of the lithographic projection apparatus along a support direction and having a finite negative stiffness in a direction that is substantially perpendicular to the support direction.

36. An apparatus according to claim 35, wherein an auxiliary support structure to apply an additional force on the support member along the support direction is provided.

37. An apparatus according to claim 35, further comprising a vacuum chamber having a wall enclosing the support member, wherein the support member comprises:

a gas-filled pressure chamber, the gas in the pressure chamber acting on a movable member such as to at least partially counteract a force substantially parallel to the support direction, and a pressure relief structure constructed and arranged to allow evacuation of gas escaping towards the vacuum chamber through a gap between the movable member and a bearing surface.

38. An apparatus according to claim 37, wherein the support member bearing surface, comprises a bearing supporting the movable member and maintaining the gap between member and the bearing surface, the bearing comprising a gas bearing and arranged to provide pressurized gas into the gap thereby generating forces hold the movable member away from the bearing surface, and the pressure relief provided between the gas bearing and the vacuum chamber along the movable to remove gas from the gap.

39. An apparatus according to claim 35, wherein the apparatus further comprises an isolated reference frame, and the support member is arranged to support the isolated reference frame.

40. An apparatus according to claim 35, wherein the support member is provided with a hollow part, and wherein a conduit is arranged through the hollow part.

* * * * *